United States Patent
Yu et al.

(12)

(10) Patent No.: US 6,190,980 B1
(45) Date of Patent: Feb. 20, 2001

(54) METHOD OF TILTED IMPLANT FOR POCKET, HALO AND SOURCE/DRAIN EXTENSION IN ULSI DENSE STRUCTURES

(75) Inventors: Bin Yu, Fremont; Ming-Ren Lin, Capertino; Emi Ishida, Sunnyvale, all of CA (US)

(73) Assignee: Advanced Micro Devices, Sunnyvale, CA (US)

( * ) Notice: Under 35 U.S.C. 154(b), the term of this patent shall be extended for 0 days.

(21) Appl. No.: 09/150,874

(22) Filed: Sep. 10, 1998

(51) Int. Cl.[7] ................................................. H01L 21/336
(52) U.S. Cl. ........................ 438/302; 438/525; 438/306
(58) Field of Search ..................................... 438/302, 270, 438/180, 197, 301, 303, 305, 306, 525

(56) References Cited

U.S. PATENT DOCUMENTS

| 5,399,508 | * | 3/1995 | Nowak ................................ 438/302 |
| 5,424,229 | * | 6/1995 | Oyamatsu . | |
| 5,434,093 | * | 7/1995 | Chau et al. . | |
| 5,943,576 | * | 8/1999 | Kapoor ................................ 438/302 |
| 6,008,094 | * | 12/1999 | Krivokapic et al. ................. 438/286 |
| 6,025,232 | * | 2/2000 | Wu et al. ............................. 438/270 |

* cited by examiner

*Primary Examiner*—Tuan H. Nguyen
(74) *Attorney, Agent, or Firm*—Brinks, Hofer, Gilson & Lione

(57) ABSTRACT

A method of performing tilted implantation for pocket, halo and source/drain extensions in ULSI dense structures. The method overcomes the process limit, due to shadowing effects, in dense structures, of using large angle tilted implant techniques in ULSI circuits. A gate opening in an oxide layer is defined and partially filled by insertion of nitride spacers to define an actual gate window opening. The small angle tilted implant technique has the equivalent doping effect of large angle tilted implants, and circumvents the maximum angle limit ($\theta_{MAX}$) that occurs in the large angle implant method. The small angle tilted implant technique also automatically provides self alignment of the pocket/halo/extension implant to the gate of the device.

19 Claims, 2 Drawing Sheets

METHOD OF TILTED IMPLANT FOR POCKET, HALO AND SOURCE/DRAIN EXTENSION IN ULSI DENSE STRUCTURES

FIELD OF THE INVENTION

The present invention relates to a method for overcoming the process limit, due to shading effects in dense structures, of using large angle tilted implant techniques in ULSI circuits.

BACKGROUND OF THE INVENTION

Large angle titled implant ("LATI") of either pocket, halo or source/drain extensions is currently needed in ultra large scale integrated ("ULSI") complimentary metal oxide semiconductor ("CMOS") transistors in order to suppress "short-channel effects." Short channel effects are described in further detail in application Ser. No. 09/122,815, filed on Jul. 27, 1998, entitled MOS TRANSISTOR WITH HIGH-K SPACER DESIGNED FOR ULTRA-LARGE SCALE INTEGRATION, commonly assigned to the assignee of record for the present application, the contents of which are incorporated herein by reference.

Limitations exist, however, of applying LATI techniques in ULSI circuits. For example, due to the very high packing density of a ULSI circuit, shadowing effects from both the gate stack and photo-resist layers restricts the maximum tilt angle that can be used for ion implantation. Presently, the largest tilt angle used commercially for implants is illustrated schematically in FIG. 1. As shown in FIG. 1, the two angles $\theta_1$, $\theta_2$ corresponding to the shadowing effect from gate stacks and photo-resist layers, respectively, can be expressed according to the following equation:

$$\theta_{MAX} = \min(\theta_1 \theta_2)$$

As can be seen, the maximum tilt angle, $\theta_{max}$, is dependent upon the gate stack height A and the thickness of the photo-resist layer B. This maximum angle of implantation, however, is smaller than what a device engineer currently may desire in the fabrication of ULSI circuits, which is typically larger than 40°.

Another limitation of applying LATI techniques in ULSI circuits is that the largest angle allowable for implants is impacted by the random variation of several process parameters. These parameters include for example gate critical dimensions, the thickness of a gate stack and the thickness of the photo-resist layer. Lithography overlay may also have a significant impact. In a worst case scenario of lithography overlay, therefore, the available $\theta_{MAX}$ could ultimately be very small.

What is lacking in the art is a small angle tilted implant technique that has the equivalent doping effect of large angle tilted implants. One advantage of the small angle tilted implant technique over the large angle tilted implant technique is the circumvention of the maximum angle limit ($\theta_{MAX}$) that occurs in the large angle method. Another advantage to a small angle tilted implant technique would be self alignment of the pocket/halo/extension implant to the gate of the device.

BRIEF SUMMARY OF THE INVENTION

In view of the above, the present invention provides a method of performing tilted implantation in ULSI dense structures. According to the method of the invention, a substrate layer is provided and an oxide layer is deposited on top of the substrate layer. The oxide layer is selectively etched down to a level of substantially the substrate layer to provide a window opening in the oxide layer. Nitride spacers are then deposited within the window opening to define an actual gate window. Source, drain and gate implants can then be implanted at a small angle relative to the vertical direction (i.e., $\theta_A$). Gate material is deposited to fill the actual gate window.

One advantage of the small angle tilted implant technique over the large angle tilted implant technique is the elimination or reduction of the maximum angle limit ($\theta_{MAX}$) that occurs in the large angle method. Another advantage to the small angle tilted implant technique of the invention is the self alignment of the pocket/halo/extension implant to the gate of ULSI device.

These and other features an advantages of the invention will become apparent upon a review of the following detailed description of the presently preferred embodiments of the invention taken in conjunction with the appended drawings.

DETAILED DESCRIPTION OF THE PRESENTLY PREFERRED EMBODIMENTS OF THE INVENTION

Figure 2:
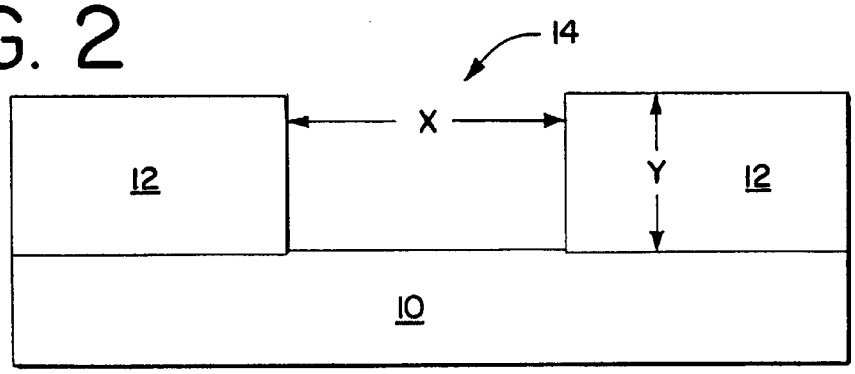
FIG. 2 illustrates the opening of a window in an oxide layer according to the presently preferred embodiment of the invention.

Referring to the drawings, where like reference numerals refer to like elements throughout, one presently preferred method of small angle titled implant techniques in ULSI structures of the invention is illustrated in FIGS. 2–5. Referring first to FIG. 2, a substrate layer 10 is provided. Preferably, the substrate layer 10 is composed of silicon, but as those skilled in the art will appreciate other substrates can be employed without departing from the spirit and scope of the invention. An oxide layer 12 is deposited on top of the substrate layer 10. In the preferred embodiment the invention, the oxide layer 12 is grown to a thickness of 200–400 nanometers. A window opening 14 is then provided in the oxide layer 12 by selectively etching the oxide layer 12 in a predetermined location down to a level of substantially the substrate layer 10. The dimension of the window opening X is defined by the lithography techniques being employed, and the ratio X/Y can be adjusted to meet the need of the particular tilt angle of an implant.

Figure 1:
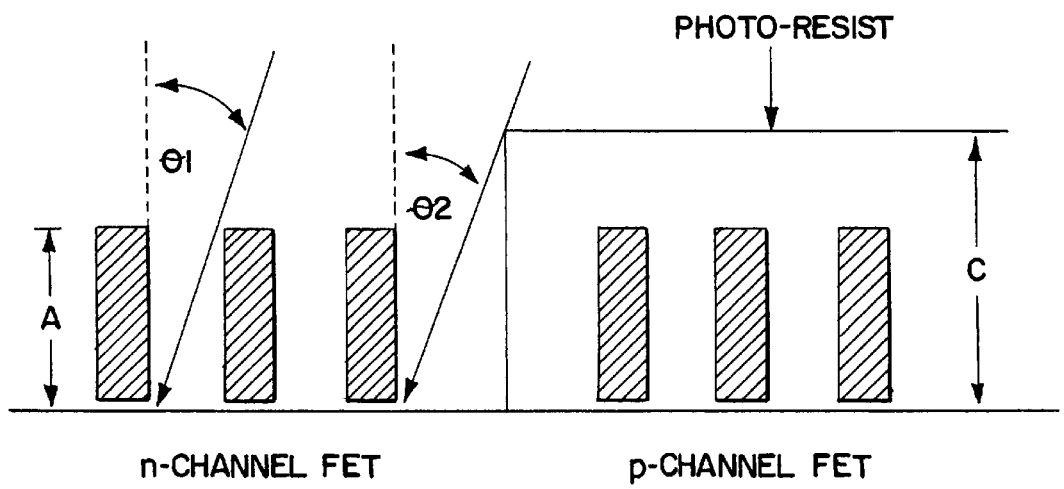
FIG. 1 illustrates the limitations encountered by the prior art large angle tilted implant technique.
Figure 3:
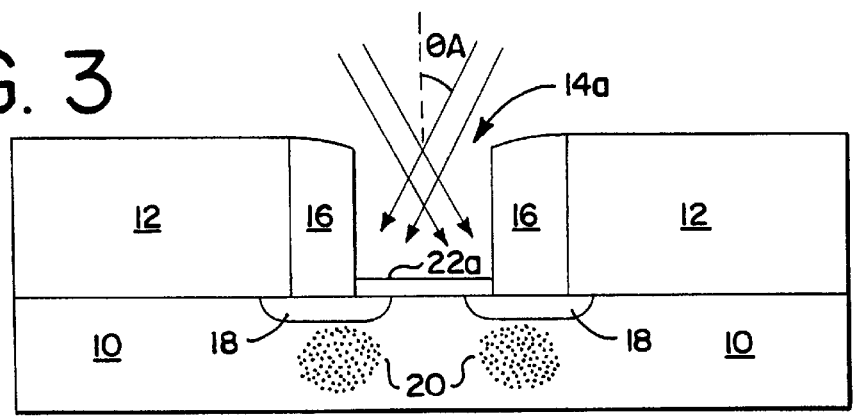
FIG. 3 illustrates the formation of nitride spacers in the window opening shown in FIG. 2.

Referring next to FIG. 3, nitride spacers 16 are deposited within and around the periphery of the window opening 14 to define the actual gate window 14a. Once the nitride spacers 16 have been deposited, a sacrificial oxide layer 22a is deposited. A small tilt angle implant is then possible of the source/drain extensions 18 and pocket 20. As shown in FIG. 3, the implantation is performed from within the actual gate window 14a. By the creation of the window opening 14 and the deposition of nitride spacers 16, the angle of the implant $\theta_A$ is necessarily smaller than the angles shown in FIG. 1 of the prior art large angle tilted implant technique.

Figure 4:
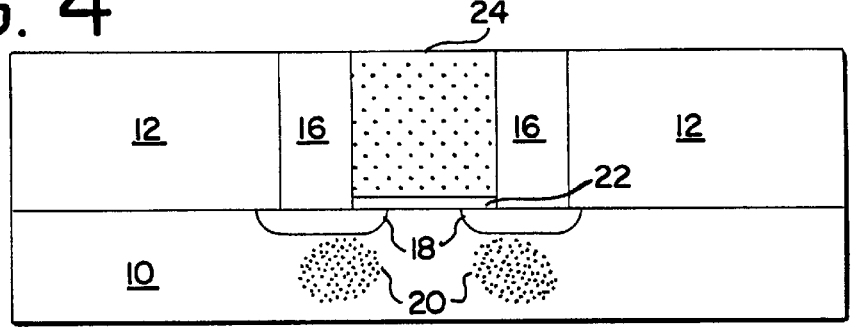
FIG. 4 illustrates the deposition of gate material in the actual gate window shown in FIG. 3.

Once the small angle implants have been provided, the sacrificial oxide layer 22a is removed and a gate oxide layer 22 is grown, as shown in FIG. 4. Preferably, the gate oxide layer 22 is grown to a thickness of 2–5 nanometers. Gate material 24 is then deposited to fill the actual gate window 14a. In the preferred embodiment of the invention, the gate material is preferably polysilicon, but those skilled in the art will appreciate that other materials can be used without departing from the spirit and scope of the invention. After deposition of the gate material 24, the gate material 24 is polished down to the desired gate height. A chemical, mechanical polish ("CMP") generally know in the art is preferably used to polish down the gate material 24.

Figure 5:
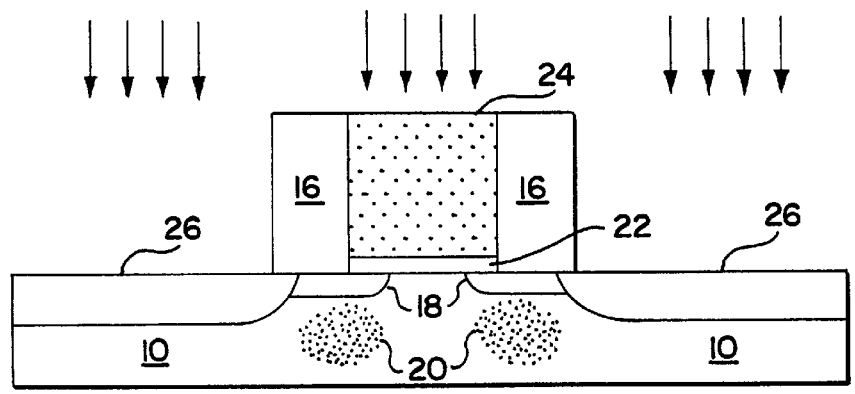
FIG. 5 illustrates the step of oxide removal and source/drain/gate implantation to the structure shown in FIG. 4.

Referring next to FIG. 5, the oxide layer 12 is then removed using conventional oxide etch techniques generally known in the art. Source, drain and gate implants 26 can then be provided, also through generally known techniques, to the structure shown in FIG. 5. As those skilled in the art will appreciate, additional structures such as the one illustrated in FIG. 5 can be created successively in both lateral dimensions according to the particular design parameters being used. In addition, the structure shown in FIG. 5 can also be created in successive vertical layers as those skilled in the art will appreciate if multi-layered structures are being employed.

The above-described small angle tilted implant technique has the equivalent doping effect of large angle tilted implants. The small angle tilted implant technique also circumvents the maximum angle limit ($\theta_{MAX}$) that occurs in the large angle implant method. Due to the method of the invention, the small angle tilted implant technique also automatically provides self alignment of the pocket/halo/extension implant to the gate of the ULSI device.

It is to be understood that a wide range of changes and modifications to the embodiments described above will be apparent to those skilled in the art and are therefore contemplated. It is further intended that the foregoing detailed description be regarded as illustrative, rather than limiting, and that it be understood that it is the following claims, including all equivalents, that are intended to define the spirit and scope of the invention.

We claim:

1. A method of performing tilted implantation in ULSI dense structures, comprising the steps of:

providing a substrate layer;

depositing an oxide layer on top of the substrate layer;

selectively etching the oxide layer to provide a window opening in the oxide layer;

depositing nitride spacers within the window opening to define an actual gate window;

depositing gate material to fill the actual gate window;

removing the oxide layer; and implanting source/drain extensions and pocket implants through the window opening after the step of depositing nitride spacers.

2. The method defined in claim 1, further comprising the step of implementing halo implants through the window opening after the step of depositing nitride spacers.

3. The method defined in claim 1, further comprising the step of polishing the gate material down to a predetermined gate height.

4. The method defined in claim 3, wherein the step of polishing the gate material down to a predetermined gate height is achieved through a chemical mechanical polish.

5. The method defined in claim 1, further comprising the step of growing a gate oxide layer.

6. The method defined in claim 1, wherein the nitride spacers are deposited around a periphery of the window opening.

7. The method defined in claim 1, wherein the gate material comprises polysilicon.

8. The method defined in claim 1, further comprising the step of successively creating tilted implants in two lateral dimensions through the window opening after the step of depositing nitride spacers, wherein the substrate layer defines said two lateral dimensions.

9. The method defined in claim 1, further comprising the step of creating tilted implants in successive vertical layers in multi-layered structures.

10. The method defined in claim 1, further comprising the step of implanting pocket, halo and source/drain extensions.

11. The method defined in claim 10, further comprising the step of self aligning the pocket, halo and source/drain extension implants to the actual gate window.

12. The method defined in claim 1, wherein the oxide layer is selectively etched.

13. A method of forming a semiconductor structure, comprising:

implanting source/drain extensions and pocket implants through an opening of a structure, wherein the structure comprises:

a substrate;

a first oxide layer on the substrate, the first oxide layer having the opening; and nitride spacers within the opening.

14. The method of claim 13, wherein the structure further comprises a sacrificial oxide layer within the opening.

15. The method of claim 14, further comprising:

removing the sacrificial oxide layer after the implanting of source/drain extensions and pocket implants; and depositing a gate oxide layer within the opening after the removing of the sacrificial oxide layer.

16. The method of claim 15 further comprising depositing gate material within the opening after the depositing of the gate oxide layer within the opening.

17. The method of claim 13, further comprising:

growing a gate oxide layer within the opening after the implanting of source/drain extensions and pocket implants;

depositing gate material within the opening after the growing of the gate oxide layer within the opening; and removing the first oxide layer.

18. The method of claim 17, further comprising polishing the gate material.

19. A method of forming a semiconductor structure, comprising:

providing a structure, wherein the structure comprises a substrate, an oxide layer on the substrate, the oxide layer having an opening, and nitride spacers within the opening; followed by implanting pocket implants through the opening.

* * * * *